(12) United States Patent
Niebojewski et al.

(10) Patent No.: US 9,117,805 B2
(45) Date of Patent: Aug. 25, 2015

(54) AIR-SPACER MOS TRANSISTOR

(71) Applicants: STMicroelectronics S.A., Montrouge (FR); STMicroelectronics (Crolles 2) SAS, Crolles (FR); Commissariat à l'Énergie Atomique et aux Énergies Alternatives, Paris (FR)

(72) Inventors: Heimanu Niebojewski, Grenoble (FR); Yves Morand, Grenoble (FR); Cyrille Le Royer, Tullins (FR)

(73) Assignees: STMicroelectronics SA, Montrouge (FR); STMicroelectronics (Crolles 2) SAS, Crolles (FR); Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/169,913

(22) Filed: Jan. 31, 2014

(65) Prior Publication Data
US 2014/0217520 A1 Aug. 7, 2014

(30) Foreign Application Priority Data

Feb. 4, 2013 (FR) ..................................... 13 50941

(51) Int. Cl.
*H01L 29/66* (2006.01)
*H01L 21/28* (2006.01)
*H01L 29/49* (2006.01)
*H01L 29/423* (2006.01)

(52) U.S. Cl.
CPC .......... *H01L 29/49* (2013.01); *H01L 21/28008* (2013.01); *H01L 21/28114* (2013.01); *H01L 29/42376* (2013.01); *H01L 29/4925* (2013.01); *H01L 29/4991* (2013.01); *H01L 29/6653* (2013.01)

(58) Field of Classification Search
CPC .................. H01L 21/28114; H01L 29/42376; H01L 29/4991; H01L 29/6653; H01L 21/28008; H01L 29/49; H01L 29/4925; H01L 29/66545
USPC .......................................... 438/421; 257/410
See application file for complete search history.

(56) References Cited

U.S. PATENT DOCUMENTS

| | | | |
|---|---|---|---|
| 5,583,067 A * | 12/1996 | Sanchez ........................ | 438/289 |
| 5,869,374 A | 2/1999 | Wu | |
| 6,355,547 B1 * | 3/2002 | Lee et al. ...................... | 438/586 |
| 6,420,218 B1 * | 7/2002 | Yu .................................. | 438/142 |
| 6,448,140 B1 * | 9/2002 | Liaw ............................. | 438/279 |
| 2002/0072182 A1 * | 6/2002 | Ha et al. ........................ | 438/301 |
| 2002/0163036 A1 | 11/2002 | Miura et al. | |
| 2003/0211684 A1 * | 11/2003 | Guo ............................... | 438/230 |
| 2003/0235943 A1 * | 12/2003 | Trivedi ........................... | 438/197 |
| 2007/0102766 A1 * | 5/2007 | Furukawa et al. ............. | 257/368 |

(Continued)

OTHER PUBLICATIONS

French Search Report and Written Opinion dated Jul. 2, 2013 from corresponding French Application No. 13/50941.

*Primary Examiner* — Jarrett Stark
*Assistant Examiner* — Bitew Dinke
(74) *Attorney, Agent, or Firm* — Gardere Wynne Sewell LLP

(57) ABSTRACT

A MOS transistor including, above a gate insulator, a conductive gate stack having a height, a length, and a width, this stack having a lower portion close to the gate insulator and an upper portion, wherein the stack has a first length in its lower portion, and a second length shorter than the first length in its upper portion.

15 Claims, 2 Drawing Sheets

(56) References Cited

U.S. PATENT DOCUMENTS

| | | | |
|---|---|---|---|
| 2007/0296039 A1* | 12/2007 | Chidambarrao et al. | 257/355 |
| 2008/0254579 A1 | 10/2008 | Chi et al. | |
| 2009/0275182 A1* | 11/2009 | Chang et al. | 438/287 |
| 2009/0307635 A1* | 12/2009 | Chang et al. | 716/1 |
| 2010/0200934 A1* | 8/2010 | Chen et al. | 257/402 |
| 2012/0199886 A1* | 8/2012 | Horak et al. | 257/288 |
| 2013/0248950 A1* | 9/2013 | Kang et al. | 257/288 |
| 2013/0277751 A1* | 10/2013 | Ando et al. | 257/369 |
| 2013/0299920 A1* | 11/2013 | Yin et al. | 257/408 |
| 2013/0337656 A1* | 12/2013 | Chambers et al. | 438/763 |
| 2014/0024192 A1* | 1/2014 | Kim et al. | 438/296 |
| 2014/0103407 A1* | 4/2014 | Chang et al. | 257/288 |
| 2014/0138779 A1* | 5/2014 | Xie et al. | 257/401 |
| 2014/0246724 A1* | 9/2014 | Jang et al. | 257/368 |

\* cited by examiner

AIR-SPACER MOS TRANSISTOR

CROSS REFERENCE TO RELATED APPLICATION

This application claims priority to French Patent Application No. 13/50941, filed Feb. 4, 2013, which is hereby incorporated by reference to the maximum extent allowable by law.

BACKGROUND

1. Technical Field

The present disclosure relates to MOS transistors, and more specifically to air-spacer MOS transistors.

2. Discussion of the Related Art

In the forming of a MOS transistor, it is generally desired to decrease the power consumption on switching and to increase the switching speed. Such parameters especially depend on the gate-source, gate-drain, gate-source contact, and gate-drain contact capacitances.

Such stray capacitances tend to become particularly significant in the case of MOS transistors of very small size, where the gate lengths are shorter than some hundred nanometers, and especially shorter than 20 nm. Indeed, in this case, the distances between the gate, on the one hand, and the source, the drain, the source contact, and the drain contact, on the other hand, become extremely small. A solution to decrease such stray capacitances comprises surrounding the sides of the gate on either side of its length with air (vacuum) spacers instead of conventionally using spacers made of a solid dielectric material. This is, for example, described in article "Air Spacer MOSFET Technology for 20 nm Node and Beyond" by Jemin Park and Chenming Hu, 9th ICSICT— Oct. 20-23, 2008—IEEE 2008.

Appended FIG. 1 is a copy of FIG. 3(d) of this article. It shows a MOS transistor at an intermediate manufacturing step. This transistor is formed on a substrate covered with a gate stack. On either side of the gate are formed source and drain regions (S/D). The upper surface of the gate supports an oxide (Mask Oxide). The gate and the oxide covering it are surrounded with air spacers. Self-aligned contact (SAC) regions respectively contacting the source and drain regions can be found on either side of these spacers. The entire structure is coated with an insulating layer (ILD2). The air spacers illustrated in FIG. 1 result from the removal by etching of dielectric spacers previously formed on either side of the gate.

This article is an example only of documents of the state of the art relating to air-spacer structures. U.S. Pat. No. 6,001,695 of Texas Instruments and U.S. Pat. No. 7,132,342 of National Semiconductor can also be mentioned.

It would be desirable to further decrease the stray gate capacitances of an air-spacer MOS transistor.

SUMMARY

Thus, an embodiment provides a MOS transistor comprising, above a gate insulator, a conductive gate stack having a height, a length, and a width, this stack having a lower portion close to the gate insulator and an upper portion, wherein said stack has a first length in its lower portion, and a second length shorter than the first length in its upper portion.

According to an embodiment, the second length is equal to from 0.3 to 0.9 times the first length.

According to an embodiment, the conductive gate stack is bordered with air spacers extending widthwise.

According to an embodiment, the conductive gate stack is further bordered with dielectric spacers, delimiting the air spacers.

According to an embodiment, the lower portion of the conductive gate stack comprises at least one layer of a first material, and the upper portion comprises at least one second material.

According to an embodiment, the lower portion comprises a portion of a metal layer.

According to an embodiment, the upper portion comprises a portion of a doped semiconductor layer.

According to an embodiment, the doped semiconductor layer is a polycrystalline silicon or silicon-germanium layer.

According to an embodiment, the lower portion of the conductive gate stack comprises a layer of a metal or of a metal alloy and a doped polysilicon layer, and the upper portion comprises a doped polycrystalline silicon-germanium layer.

According to an embodiment, the lower portion of the conductive gate stack comprises a layer of a first metal or metal alloy, and the upper portion comprises a layer of a second metal or metal alloy.

A method for manufacturing a MOS transistor comprising, above a gate insulator, a conductive gate stack having a height, a length, and a width is also provided, comprises:

forming around a gate stack at least one first spacer surrounded with another material;

removing the first spacer to form a cavity;

decreasing the length of an upper portion of the gate stack;

closing the upper aperture of the cavity by a non-conformal method while depositing a dielectric on the walls of the gate stack; and removing the components of the gate stack and replacing them with a conductive metal.

The foregoing and other features and advantages will be discussed in detail in the following non-limiting description of specific embodiments in connection with the accompanying drawings.

As usual in the representation of integrated circuits, the various drawings are not to scale.

DETAILED DESCRIPTION

The use of air spacers has the advantage over the use of solid dielectric spacers that air (or vacuum) has a very low dielectric constant, close to 1, while the materials currently used in microelectronics for spacers, such as silicon oxide or silicon nitride, have dielectric constants higher than 2.5, or even 4. Further, it is generally desirable to decrease the size of spacers, on the one hand for the simplicity of their forming, on the other hand to reduce the size of components to which these spacers are associated.

As will be gathered from an analysis of the various documents describing air spacers, such spacers are obtained by first forming solid dielectric spacers, and by then removing these spacers by etching and closing the upper portion of the cavity thus formed. The general size of spacers is thus imposed by technology.

Further, the case where the transistor which is desired to be manufactured is a transistor of minimum size, that is, where the gate length (the dimension considered in the source-to-drain direction) of the transistor corresponds to the smallest dimension that can be obtained in a considered technology, is generally considered. Thus, the length of the gate at the level of its contact with the gate insulator is imposed by technology.

Generally, the gate is made in the form of a stack of conductive materials, the gate height being especially selected to enable to provide an upward contact, substantially at the same level as contacts towards the source and drain areas.

It is here provided to form a conventional gate, and then to decrease the length of its upper portion without changing the other dimensions of the structure. As a result, on the portion of decreased length, the distance between the gate and the source and drain contacts is increased, which results in a decrease in the value of the gate-source contact and gate-drain contact capacitances, and possibly of the gate-source and gate-drain capacitances.

Figure 1:
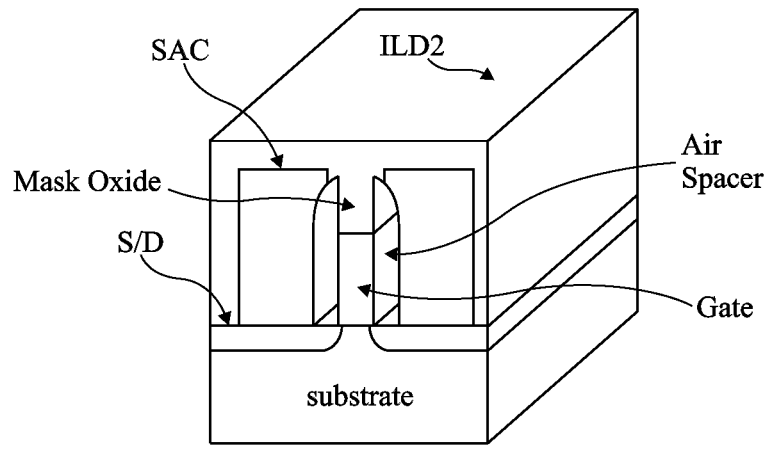
FIG. 1 is a copy of FIG. 3(d) of Park et al.'s above-mentioned article.
Figure 2:
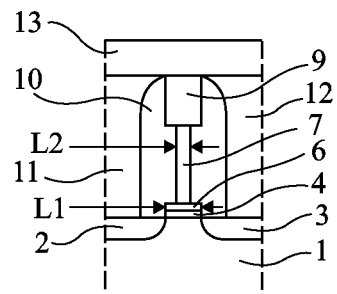
FIG. 2 is a cross-section view showing a first embodiment of an air-spacer MOS transistor.

FIG. 2 schematically shows a modification of the structure shown in FIG. 1, incorporating the above-discussed principles. FIG. 2 shows a substrate 1 having source and drain regions 2 and 3 formed therein on either side of a conductive gate formed on a gate insulator 4. The gate comprises a lower portion 6 of length L1 made of at least one first conductive material topped with an upper portion 7 made of at least a second conductive material having a length L2 shorter than L1. The upper gate portion is topped with an insulator 9 of same length L1 as lower gate portion 6. The gate structure comprising conductive gate 6-7 and upper insulator 9 is laterally surrounded with spacers 10. These spacers are, as in the case of FIG. 1, vacuum spacers or air spacers 10. On either side of the air spacers are located respective source contact and drain contact conductive regions 11 and 12. The entire structure is coated with an insulating layer 13.

It should be understood that various methods may be used to obtain the structure of FIG. 2. First, it could have been proceeded exactly in the same way as to obtain the structure of FIG. 1 while however providing, before closing with insulating layer 13 the openings emerging into the upper portions of vacuum spacers 10, an etching by a selective product enabling to etch upper gate portion 7. One may also have first formed the gate comprising lower portion 6 of length L1 and upper portion 7 of length L2 shorter than L1 and then only have formed spacers of a dielectric material which, after the forming of drain and source regions 11 and 12 and before the forming of closing layer 13, will have been removed by selective etching.

The above-described structure derives from the structure described in article "Air Spacer MOSFET Technology for 20 nm Node and Beyond" by Jemin Park and Chenming Hu 9th ICSICT—Oct. 20-23, 2008—IEEE 2008. This structure is capable of having many variations. The second conductive material of upper gate portion 7 may be a doped semiconductor material. Upper gate portion 7 may be topped with a conductive material rather than with an insulator 9. At an intermediate manufacturing stage, the areas designated with reference numerals 11 and 12 may be insulating regions.

It should be clear that a structure of the type shown in FIG. 2 will have lower gate-drain contact and gate-source contact capacitances than a structure such as that in FIG. 1 due to the distance increase between the upper gate portion and the source contact and drain contact areas.

Figure 3:
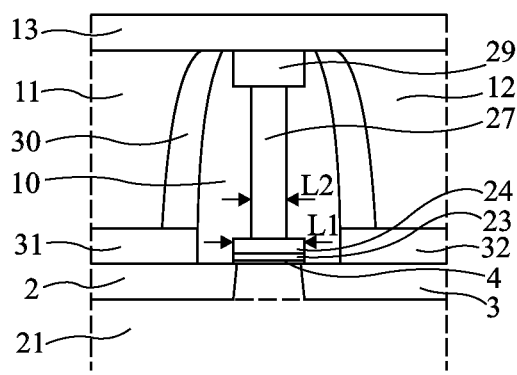
FIG. 3 is a cross-section view showing a second embodiment of an air-spacer MOS transistor.

FIG. 3 shows another embodiment of an air-spacer MOS transistor with low stray capacitances. As previously, the structure comprises source and drain regions 2 and 3 and a gate insulation layer 4. Source and drain areas 2 and 3 may be formed in a portion of the upper surface of a solid semiconductor substrate or in a thin single-crystal silicon layer formed on an insulator, itself generally formed on a semiconductor substrate, not shown, to form a so-called silicon-on-insulator structure currently referred to as SOI. Thus, reference numeral 21 designates either a semiconductor substrate, or an insulating layer. The lower portion of the conductive gate stack comprises two conductive regions 23 and 24, lower region 23 being preferably made of a metal or metal alloy, the optional upper region being preferably made of a doped semiconductor material. Upper portion 27 of the conductive gate stack is made of a conductive material selectively etchable over conductive materials 23 and 24. Upper portion 27 has a length L2 shorter than length L1 of lower portion 23-24. Intermediate layer 24 is provided to improve the contact between upper portion 27 and lower portion 23 and to ascertain that the lower portion of the gate is effectively equipotential. As previously, the structure is topped with an insulating or conductive region 29, which, in the shown example, has the same length L1 as lower portion 23-24 of this gate stack. The gate structure is surrounded with an air spacer 10, itself surrounded with a second spacer 30 made of a solid dielectric material. Semiconductor source and drain regions 31, 32, currently provided in the case where layer 2 is a very thin silicon-on-insulator layer, have also been shown above the source and drain regions. Outside of spacers 30 are located source and drain contact regions 11 and 12 and the assembly is topped with an insulating layer 13.

The structure may be obtained by a method substantially identical to that described in relation with FIG. 2. After the forming of a first spacer which will be replaced with the air spacer, epitaxial regions 31 and 32 for thickening the source and drain regions are formed. Second spacer 30 is then formed, after which the first intermediate spacer is removed by etching to form air spacer 10. The two spacers may also be removed to form a larger air spacer.

Many types of materials may be used to form the structure. As an example, it will be considered that:
  layer 21 is a silicon-on-insulator layer,
  regions 31 and 32 are epitaxial silicon layers,
  the gate insulator is a material of high permittivity, for example, HfSiON,
  lower layer 23 of the conductive gate stack is a metal, or a metal compound such as TiN,
  intermediate layer 24 of the conductive gate stack is doped polysilicon,
  upper portion 27 of the conductive gate stack is made of silicon-germanium.

If the first spacer which is replaced with the empty cavity is made of silicon nitride, second spacer 30 may be made of silicon oxide.

It should be reminded that a structure of the type of that in FIG. 2 comprising no second spacer may also be envisaged.
  As an example of dimensions:
  the gate length, that is, length L1 of regions 23 and 24, may be on the order of 14 nm,
  the height of the conductive gate stack may approximately range from 30 to 60 nm, layers 23 and 24 for example having 5-nm thicknesses and layer 27 having a 40-nm thickness,
  length L2 of the upper gate portion may approximately range from 5 to 10 nm or more generally from 30 to 90% of length L1 of the base of the gate stack,
  the spacers may have lengths ranging from 5 to 50 nm.

FIGS. 4A to 4D show successive steps of the manufacturing of another embodiment of an air-spacer MOS transistor with low gate-source and gate-drain capacitances. These drawings are cross-section views showing two transistors side-by-side, the drain of one of them being connected to the source of the other.

Figure 4A:
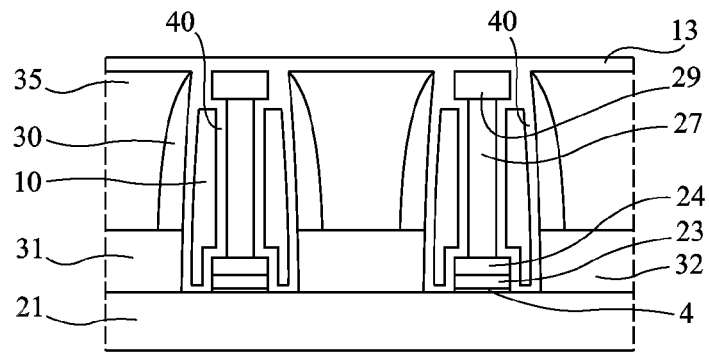
FIGS. 4A to 4D are cross-section views showing successive steps carried out to obtain a third embodiment of air-spacer MOS transistors.

Each of the structures of FIG. 4A is substantially identical to that of FIG. 3 and the same elements are designated with the same reference numerals therein. However, two differences appear between the representation of FIG. 4A and that of FIG. 3.

On the one hand, in FIG. 4A, source contact and drain contact regions 11-12 are replaced with insulating regions 35. This step comes prior to the forming of the drain and source contact regions. It should be noted by those skilled in the art that some of these steps may be carried out in different orders.

On the other hand, it has been shown that, during the first part of the deposition of the material of layer 13 across a thickness greater than half the dimension of the upper aperture of the cavity in order to close this aperture, a thin layer 40 of this material has been formed on all the surfaces of these cavities.

Figure 4B:
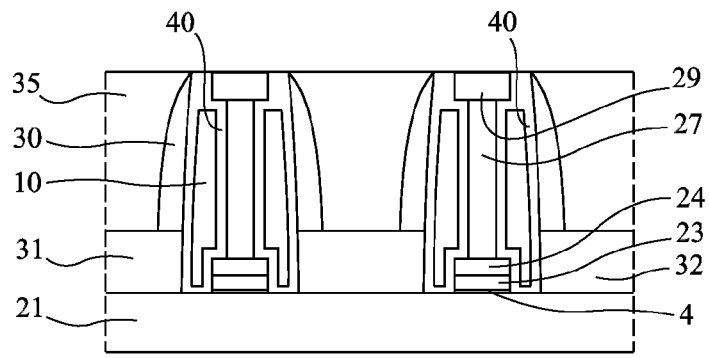

FIG. 4B shows the structure of FIG. 4A after removal by chemical-mechanical polishing (CMP) of upper insulating layer 13.

Figure 4C:
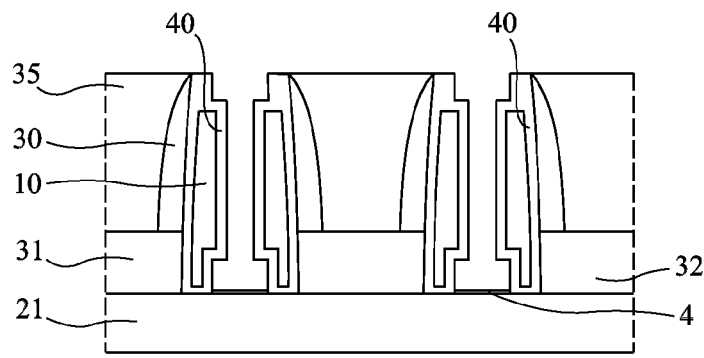

At the step illustrated in FIG. 4C, all conductive elements have been removed from the gate stack. More specifically, insulating portion 29, upper conductive portion 27, intermediate portion 24, and lower conductive layer 23 have been removed. Gate insulator 4 may be removed and a new gate insulator is deposited.

Figure 4D:
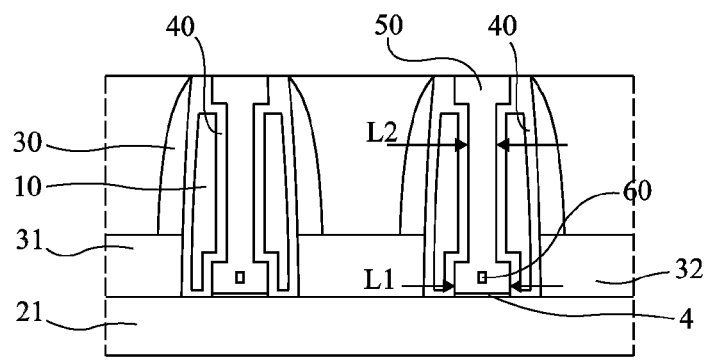

At the step illustrated in FIG. 4D, a new gate metal 50 has been deposited by a conformal physical or chemical method, which metal can be selected from the group comprising W, Ti, and TiN. The deposition of metal 50 may be preceded by a step of deposition of a gate insulation layer. It should be noted that, in this embodiment, an air bubble 60 may appear at the shown location.

Specific embodiments have been described. Various alterations, modifications, and improvements will occur to those skilled in the art. In particular, the present description has been made in relation with MOS transistors. It should be understood that term "MOS transistor" should be interpreted in a broad sense and especially covers cases where the concerned structure forms a switching transistor or a memory node, and a simple- or double-gate structure. Although only MOS transistors where the source and drain contacts are self-aligned on the gate spacers have been described and shown herein, the present application also applies to the case of contacts which are not self-aligned.

It should further be noted that the structures described and shown herein have been shown and described at intermediate manufacturing steps. Subsequent steps may easily be implemented by those skilled in the art of integrated circuit manufacturing, especially as concerns the carrying out of possible siliciding steps.

Further, various embodiments with different variations have been described hereabove. Those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a MOS transistor comprising:
    forming a gate stack having a height, a length, and a width and comprising a lower portion, a middle portion and an upper portion;
    forming around the gate stack at least one first spacer surrounded with another material;
    removing the first spacer to form a cavity on each side of the gate stack;
    decreasing the length of the middle portion of the gate stack in said cavity such that the length of the middle portion is less than the lengths of the lower and upper portions;
    closing an upper aperture of the cavity by a non-conformal method while depositing a dielectric layer on the walls of the gate stack with the decreased length middle portion so as to provide an air spacer;
    removing the lower, decreased length middle and upper portions of the gate stack to provide a gate stack opening; and
    filling the gate stack opening with a conductive metal to form a metal gate having a lower conductive portion, a middle conductive portion and an upper conductive portion, wherein the length of the middle conductive portion is less than the lengths of the lower and upper conductive portions.

2. The method of claim 1, wherein decreasing the length of the middle portion produces a length equal to from 0.3 to 0.9 the length of the lower and upper portions of the gate stack.

3. The method of claim 1, wherein the air spacer extends along said length of the gate stack and is provided on opposite sides of the gate stack.

4. The method of claim 3, wherein the dielectric layer on the walls of the gate stack delimits said air spacer.

5. The method of claim 1, wherein the lower portion of the gate stack comprises a first material and the middle portion of the gate stack comprises a second material.

6. The method of claim 5, wherein the lower portion comprises a portion of a metal layer.

7. The method of claim 5, wherein the middle portion comprises a portion of a doped semiconductor layer.

8. The method of claim 7, wherein the doped semiconductor layer is one of a polycrystalline silicon layer or a silicon-germanium layer.

9. The method of claim 1, wherein forming the gate stack comprises:
    forming the lower portion of the gate stack with a layer of a metal or a metal alloy and a doped polysilicon layer; and
    forming the middle portion of the gate stack with a doped polycrystalline silicon-germanium layer.

10. The method of claim 1, wherein forming the gate stack comprises:
    forming the lower portion of the gate stack with a layer of a first metal or metal alloy; and
    forming the middle portion of the gate stack with a layer of a second metal or metal alloy.

11. A method for manufacturing a MOS transistor comprising:
    forming a gate stack having a height, a length, and a width and comprising a lower portion, a middle portion and an upper portion;
    forming around the gate stack a first spacer surrounded with another material;

removing the first spacer to form a cavity in said another material;

reducing a length of the middle portion of the gate stack in said cavity relative to the lengths of the lower and upper portions;

lining side walls of the cavity and the gate stack with an insulating material;

closing an upper aperture of the cavity so as to provide an air spacer defined by the lined side walls;

removing the gate stack to provide a gate stack opening; and filling the gate stack opening with a conductive metal to form a metal gate having a lower conductive portion, a middle conductive portion and an upper conductive portion, wherein the length of the middle conductive portion is less than the lengths of the lower and upper conductive portions.

12. The method of claim 11, wherein forming the gate stack comprises:

forming the lower portion of the gate stack with at least one layer of a metal material; and forming the middle portion of the gate stack with a portion of a doped semiconductor layer, said doped semiconductor layer comprising one of a polycrystalline silicon layer or a silicon-germanium layer.

13. The method of claim 11, wherein forming the gate stack comprises:

forming the lower portion of the gate stack with a layer of a metal or a metal alloy and a doped polysilicon layer; and forming the middle portion with of the gate stack with a doped polycrystalline silicon-germanium layer.

14. The method of claim 11, wherein forming the gate stack comprises:

forming the lower portion of the gate stack with a layer of a first metal or metal alloy; and forming the middle portion of the gate stack with a layer of a second metal or metal alloy.

15. The method of claim 11, wherein reducing the length of the middle portion of the gate stack in said cavity comprises etching material of the middle portion at a rate faster than the materials of the lower and upper portions.

* * * * *